(12) United States Patent
Kano et al.

(10) Patent No.: US 7,533,459 B2
(45) Date of Patent: May 19, 2009

(54) ELECTRONIC COMPONENT MOUNTING METHOD AND ELECTRONIC COMPONENT MOUNTING APPARATUS

(75) Inventors: Yoshinori Kano, Gunma (JP); Takeshi Tomifuku, Ashikaga (JP); Yoshinori Okamoto, Gunma (JP); Yoshinao Usui, Tatebayashi (JP); Ikuo Takemura, Gunma (JP)

(73) Assignee: Hitachi High-Tech Instruments, Co., Ltd., Gunma (JP)

( * ) Notice: Subject to any disclaimer, the term of this patent is extended or adjusted under 35 U.S.C. 154(b) by 314 days.

(21) Appl. No.: 11/113,318

(22) Filed: Apr. 25, 2005

(65) Prior Publication Data

US 2005/0250223 A1    Nov. 10, 2005

(30) Foreign Application Priority Data

Apr. 27, 2004    (JP) .............................. 2004-131300

(51) Int. Cl.
 *H05K 3/30* (2006.01)
(52) U.S. Cl. .............................. 29/832; 29/833; 29/834; 29/740; 29/743; 29/721
(58) Field of Classification Search ........... 29/832–834, 29/743, 720, DIG. 44; 356/616; 414/730, 414/737; 700/121; 716/19
See application file for complete search history.

(56) References Cited

U.S. PATENT DOCUMENTS

| | | | | |
|---|---|---|---|---|
| 5,003,692 | A | * | 4/1991 | Izumi et al. ..................... 29/834 |
| 5,384,956 | A | * | 1/1995 | Sakurai et al. ................. 29/834 |
| 5,539,977 | A | * | 7/1996 | Kano et al. ..................... 29/833 |
| 5,911,456 | A | * | 6/1999 | Tsubouchi et al. ............. 29/833 |
| 6,246,789 | B1 | * | 6/2001 | Hosotani et al. ............ 382/151 |
| 6,374,484 | B1 | * | 4/2002 | Yoshida et al. ................. 29/740 |
| 6,708,402 | B2 | * | 3/2004 | Hirano et al. .................. 29/833 |

(Continued)

FOREIGN PATENT DOCUMENTS

EP    1075173    2/2001

(Continued)

OTHER PUBLICATIONS

European Search Report mailed Sep. 13, 2005, directed to counterpart EP Application No. 05009233.7.

*Primary Examiner*—Minh Trinh
(74) *Attorney, Agent, or Firm*—Morrison & Foerster LLP

(57) ABSTRACT

The invention is directed to increased stabilization of a pickup operation by reducing a reaction against disturbance by reducing a feedback value when a pickup rate is improved. A positional shifting amount of an electronic component on a suction nozzle before the electronic component is mounted on a printed board is stored in a RAM each time the component is picked up at a component feeding unit until a pickup count number reaches a predetermined pickup number, and a CPU calculates an average of the positional shifting amounts. When the pickup count number reaches the predetermined pickup number, the CPU obtains a temporary coefficient by adding an initial value to a value obtained by multiplying a negative coefficient by the pickup count number, and calculates a feedback value by multiplying the temporary coefficient by the average. The calculated feedback value is added to an offset value of a component pickup position to modify the offset value, and uses the offset value in the next pickup operation at the component feeding unit.

1 Claim, 6 Drawing Sheets

U.S. PATENT DOCUMENTS

| | | | |
|---|---|---|---|
| 6,718,630 B2 * | 4/2004 | Hada et al. | 29/832 |
| 6,862,803 B2 * | 3/2005 | Kawase et al. | 29/832 |
| 6,983,538 B2 * | 1/2006 | Inoue et al. | 29/840 |
| 2005/0250223 A1 * | 11/2005 | Kano et al. | 438/1 |

FOREIGN PATENT DOCUMENTS

| | | |
|---|---|---|
| JP | 06-053696 | 5/1994 |
| JP | 07-079096 | 7/1995 |
| JP | 2000-141174 | 5/2000 |

* cited by examiner

ELECTRONIC COMPONENT MOUNTING METHOD AND ELECTRONIC COMPONENT MOUNTING APPARATUS

CROSS-REFERENCE OF THE INVENTION

This invention is based on Japanese Patent Application No. 2004-131300, the content of which is incorporated by reference in its entirety.

BACKGROUND OF THE INVENTION

1. Field of the Invention

The invention relates to an electronic component mounting method and an electronic component mounting apparatus in which an electronic component is picked up by suction from any one of a plurality of component feeding units by a suction nozzle based on a offset value of a component pickup position, and the electronic component held by suction by the suction nozzle is recognized by a recognition processing device using an image taken by a component recognition camera, and mounted on a printed board.

2. Description of the Related Art

The pickup operation has been performed by using information about a pickup position shift in each of the component feeding units. That is, an image of the electronic component held by suction by the suction nozzle is taken by the component recognition camera, and the recognition processing device recognizes the component after picking the component from the component feeding unit before mounting the component on the printed board. The relevant technology is disclosed in Japanese Patent Application Publication No. 2000-141174.

However, there has been a problem that a pickup rate is unstable for disturbance when the information about the pickup position shift obtained by the recognition process is less repeatable even once the pickup rate becomes stable, while the pickup rate increases if the information has repeatability.

SUMMARY OF THE INVENTION

The invention provides a method of mounting an electronic component. The method includes repeating a mounting operation including performing a pickup operation of picking up an electronic component using a suction nozzle from a component feeding unit based on an offset value from a proper pickup position, calculating a positional shift of the picked up electronic component with respect to the suction nozzle, counting the number of the pickup operations, and mounting the picked up electronic component on a printed board. In this method, when the number of the pickup operations is smaller than a predetermined number, a feedback value is calculated based on a first method using the calculated positional shits and is used to modify the offset value, and when the number of the pickup operations is larger than or equal to the predetermined number, the feedback value is calculated based on a second method so as to be smaller than a value calculated under the first method and is used to modify the offset value.

As a modification the method includes counting a feedback number or a success pickup rate. The invention also provides a mounting apparatus enabling this method.

DETAILED DESCRIPTION OF THE INVENTION

Figure 1:
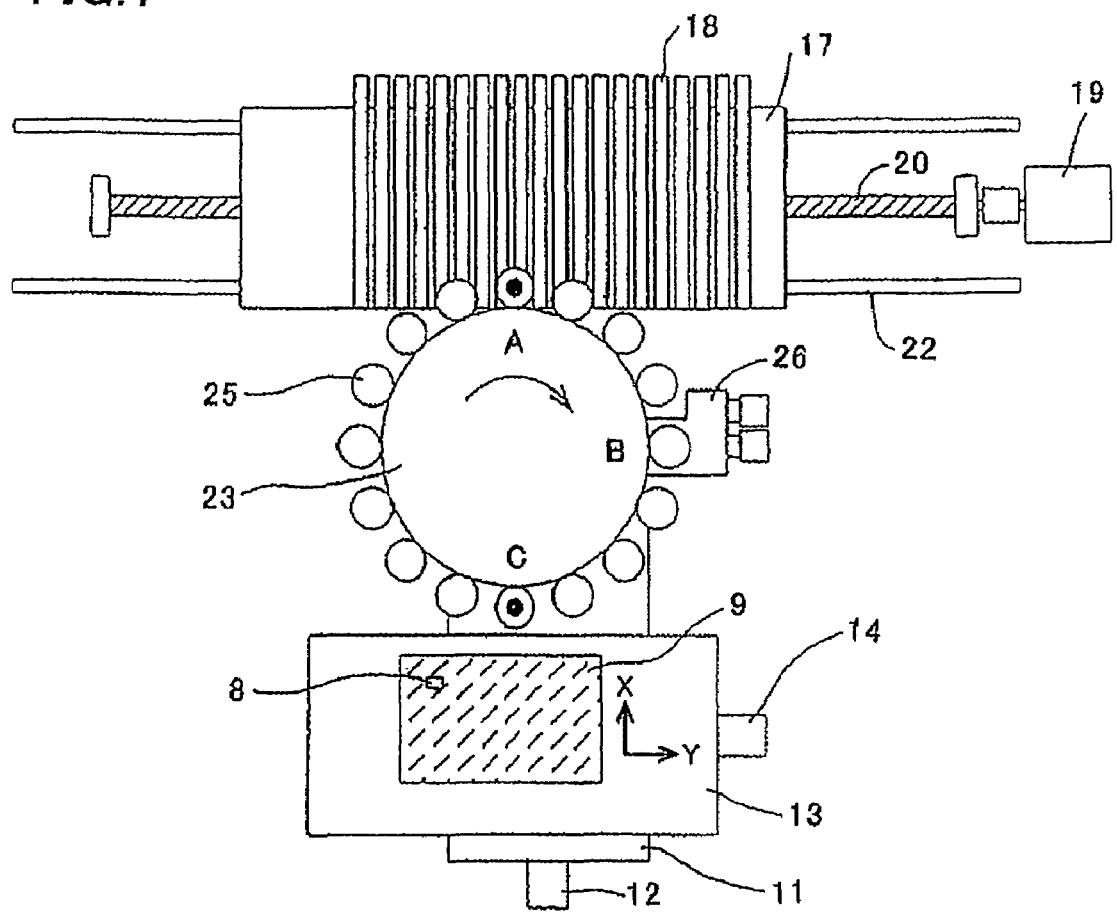
FIG. 1 is a plan view of an electronic component mounting apparatus of the invention.

Embodiments of the invention will be described with reference to drawings. In FIG. 1 showing a plan view of an electronic component mounting apparatus 5, a numeral 11 designates a Y table moving in a Y direction driven by a Y axis drive motor 12, and a numeral 13 designates a XY table moving in X and Y directions by moving in the X direction on the Y table 11 driven by a X axis drive motor 14, where a printed board 9 to be mounted with a chip-type electronic component 8 is fixed by a fixing device (not shown). A numeral 17 designates a component feeding stage which is provided with many component feeding units 18 serving as component feeding devices for feeding the electronic components 8 to a component pickup position. A numeral 19 designates a feeding stage drive motor which rotates a ball screw 20 to move the feeding stage 17 in the X direction along a linear guide 22 through a nut 21 engaged with the ball screw 20 and fixed to the feeding stage 17. A numeral 23 designates a rotary table intermittently rotating itself. On an outer circumference of the table 23, mounting heads 25 having a plurality of suction nozzles 24 serving as pickup nozzles are provided at predetermined intervals corresponding to intermittent pitches.

A pickup station A lies in a position where the mounting head 25 having the suction nozzle 24 for picking up the component 8 by suction from the feeding unit 18 stops when the rotary table 23 stops during intermittent rotation. At the pickup station A, the mounting head 25 descends and the suction nozzle 24 picks up the component 8 by suction. B designates a recognition station where the mounting head 25 holding the component 8 by suction stops during the intermittent rotation of the rotary table 23, a component recognition camera 15 takes an image of the component 8, and a recognition processing device 43 recognizes a positional shift of the component 8 from a normal position on the suction nozzle 24.

C designates a mounting station where the mounting head 25 stops so that the suction nozzle 24 mounts the holding component 8 on the printed board 9. At this mounting station C, the mounting head 25 descends, and the component 8 is mounted on the printed board 9 stopping at a predetermined position by moving of the XY table 13.

Figure 2:
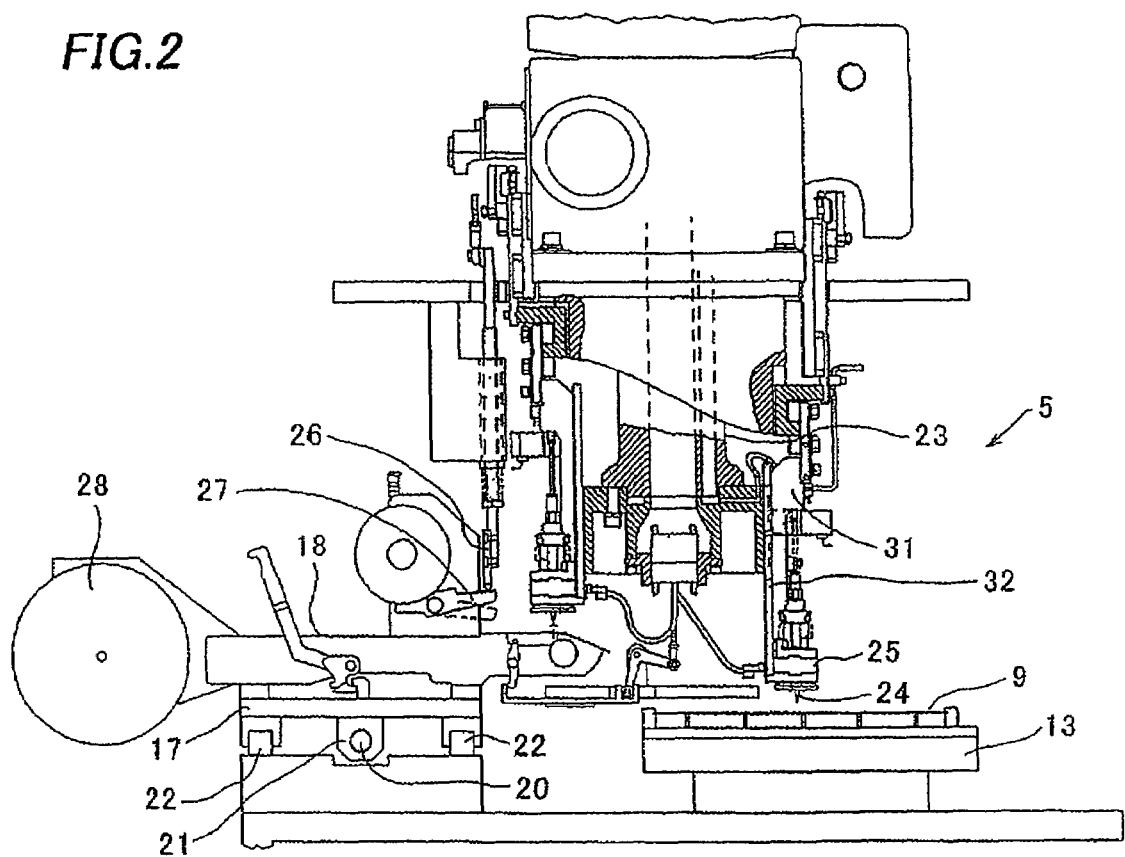
FIG. 2 is a side view of the electronic component mounting apparatus of the invention.

The mounting head 25 is attached to a linear guide 32 through a head block 31, being movable upward and downward above the rotary table 23, as shown in FIG. 2.

A numeral 26 designates a vertical movement lever moving upward and downward so as to rotate a rotation lever 27 of the component feeding unit 18. The vertical movement lever 26 rotates the lever 27 to advance a storage tape as a storage member (not shown) wound around the tape feeding reel 28 to feed the electronic component 8 stored in the storage tape to a pickup position for the nozzle 24.

Figure 3:
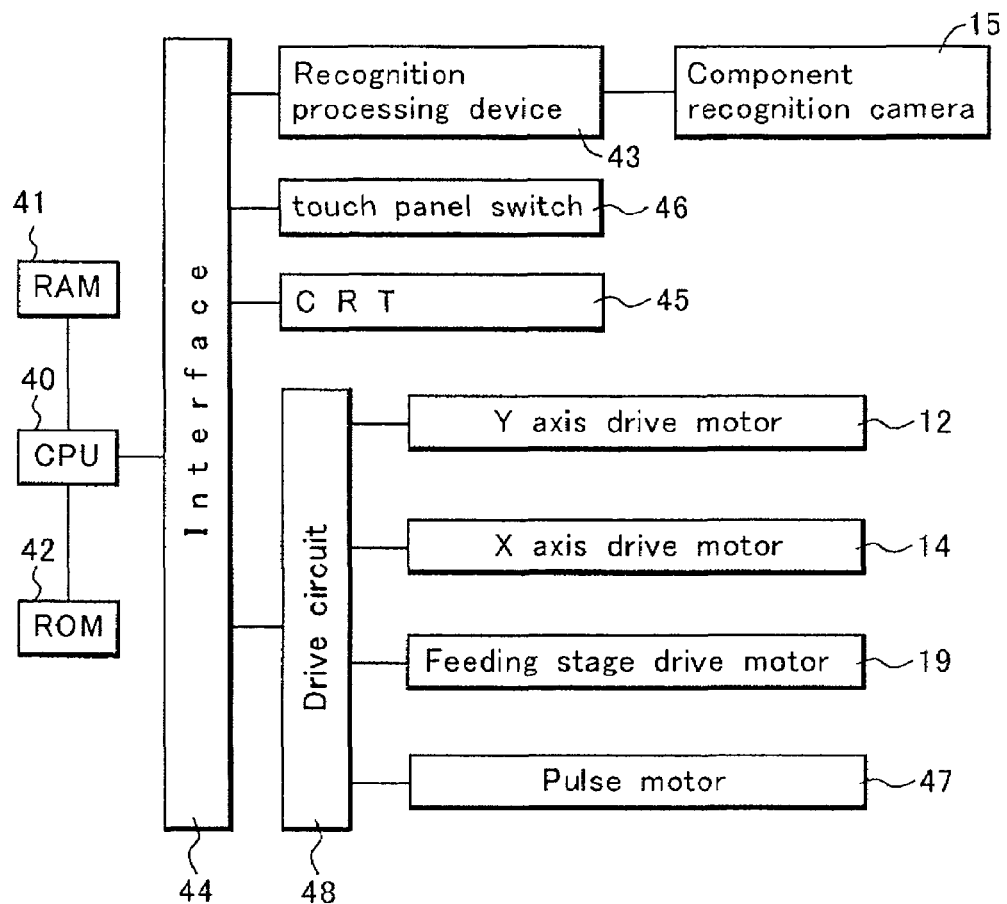
FIG. 3 is a control block diagram of the invention.

Next, a control block diagram of FIG. 3 will be described. Each of the electronic component mounting apparatuses 5 has a CPU 40 serving as a control portion controlling the apparatus 5, and a RAM (random access memory) 41 and a ROM (read only memory) 42 both connected with the CPU 40 through a bus. The CPU 40 controls a component mounting operation of the electronic component mounting apparatus 5 through an interface 44 and a drive circuit 48 based on data stored in the RAM 41 and according to a program stored in the ROM 42.

The RAM 41 is stored with mounting data on component mounting for each of types of the printed board 9, including information about X and Y directions (directed by X and Y) on the printed board 9 and an angle (directed by Z) of the component 8 in mounting order (in order of step number), and alignment numbers of the component feeding units 18. Furthermore, the RAM 41 is stored with information on the types of the electronic components (component ID) corresponding to the alignment numbers (lane numbers) of the component feeding units 18, that is, the component alignment information, and component library data on sizes and so on of the stored electronic components for each of the component IDs.

A numeral 43 designates a recognition processing device connected with the CPU 40 through the interface 44. The recognition processing device 43 performs recognition processing to images taken and stored by the component recognition camera 15, and sends a recognition result to the CPU 40. That is, the CPU 40 outputs a command to perform recognition processing (e.g. calculation of a shifting amount of an electronic component from a normal position) to images taken by the component recognition camera 15 to the recognition processing device 43, and receives a recognition processing result from the recognition processing device 43.

That is, when the recognition processing device 43 performs recognition processing and detects a shifting amount from a normal position, this recognition result is sent to the CPU 40. Then, the CPU 40 moves the printed board 9 in the X and Y directions by driving the Y axis drive motor 12 and the X axis drive motor 14 of the XY table 13 and rotates the suction nozzle 24 by an angle θ by driving the pulse motor 47, thereby completing correction in the X and Y directions and the rotating angle around a vertical axis.

The recognition processing device 43 stores the image taken by the component recognition camera 15, and the image stored is displayed on a CRT 45. The CRT 45 is provided with a variety of touch panel switches 46 as an input device for setting data, and various settings can be made by an operator's operating the touch panel switches 46. A key board can be used as the input device for setting data instead of the touch panel switches 46.

An operation under the above structure will be described hereafter. First, the printed board 9 is supplied from an upstream device, fixed on the XY table 13 by the fixing device, and moves to the component mounting position. When the mounting head 25 stops at the pickup station A during intermittent rotation of the rotary table 23 through an index system, the feeding stage drive motor 19 is driven to move the feeding stage 17, and the component feeding units 18 storing the electronic components 8 to be supplied according to the mounting data stored in the RAM 41 moves to and stops at the pickup position for the suction nozzle 24 of the mounting head 25 at the pickup station A. Then, the suction nozzle 24 descends to pick up the electronic component 8.

At this time, the vertical movement lever 26 descends to rotate the rotation lever 27 of the component feeding unit 18, advances the storage tape wound around the tape reel 28 at the pickup station A, and feeds the electronic component 8 stored in the storage tape to the pickup position for the suction nozzle 24. Furthermore, the CPU 40 controls the feeding stage drive motor 19 and the index system according to offset values of the component pickup position stored in the RAM 41. That is, correction of the component pickup position is made by moving the feeding stage 17 by driving the feeding stage drive motor 19 in the X direction and by moving the rotary table 23 by driving the index system in the Y direction. Then, the suction nozzle 24 descends and picks up the electronic component 8.

The reason why the offset values for the X and Y directions for each of the component feeding units 18 are stored in the RAM 41 is that the pickup position is slightly shifted from a designed position in each of the component feeding units 18.

Next, while the rotary table 23 intermittently rotates through the index system, the mounting head 25 holding the electronic component 8 moves to and stops at the next station. The rotary table 23 further rotates, and the mounting head 25 moves to and stops at the recognition station B. Then, the component recognition camera 15 takes an image of the electronic component 8 held by the suction nozzle 24 by suction and the recognition processing device 43 recognizes the image taken, so that a positional shift of the component 8 from a normal position on the suction nozzle 24 can be recognized.

Next, when completing the recognition processing, the CPU 40 of the electronic component mounting apparatus 5 adds an amount calculated by using a result of the recognition to the XY coordinates and the mounting angle in the mounting data stored in the RAM 41. The CPU 40 drives the pulse motor 47 for rotating the suction nozzle 24 at angles, and drives the Y axis drive motor 12 and the X axis drive motor 14 to move the XY table 13 in planar directions, by the amount calculated by adding the amount to the positional values in the mounting data.

Then, the mounting head 25 reaches the mounting station C by the rotary table 23 intermittently rotating, and the electronic component 8 positioned at the angle calculated by adding the amount to be corrected to the positional value in the mounting data is mounted on the printed board 9 positioned in the planar directions by the movement of the XY table 13.

In this manner, the electronic component 8 is picked up by suction from each of the component feeding units 18 and mounted on the printed board 9 sequentially. The printed board 9 mounted with all the electronic components 8 is conveyed to a downstream device, and the same mounting operation of the electronic components 8 is performed to the next printed board 9.

The pickup operation described above is sequentially performed. Hereafter, description will be made on a control for stabilizing the pickup operation performed in the mounting operation, based on a flowchart of FIG. 4.

When the pickup operation in which the suction nozzle 24 picks up the electronic component 8 from the component feeding unit 18 is performed, a first counter (not shown) for counting a pickup number is incremented by 1. Then, the CPU 40 determines whether or not the count number reaches a predetermined sample number Sm. When the CPU 40 determines that the count number does not reach the predetermine sample number Sm, a sampling operation is performed. The image of the electronic component 8 taken by the component recognition camera 15 as described above is recognized by the recognition processing device 43, and when the positional shift of the electronic component 8 on the suction nozzle 24 is recognized, the positional shifting amount is stored in the RAM 41.

Then, while the electronic component 8 is sequentially picked up from the component feeding unit 18, when the CPU 40 determines that the count number of the first counter (not shown) reaches the predetermined sample number Sm, the CPU 40 calculates an average r of the positional shifting amounts of the electronic components 8 on the suction nozzles 24 stored in the RAM 41 and stores the average r in the RAM 41. Then, the CPU 40 determines whether or not the count number of the first counter reaches a predetermined pickup number C. When the CPU 40 determines that the count number does not reach the predetermined pickup number C, the CPU 40 sets a temporary coefficient At at an initial value A which is obtained on trial as an optimum value and stores it in the RAM 41.

Then, the CPU 40 calculates a feedback value R by multiplying the initial value A as the temporary coefficient At by the average r, and stores the feedback value R in the RAM 41. Furthermore, the CPU 40 adds the calculated feedback value R to the offset values of the component pickup position for the X and Y directions to modify the offset values, and uses this modified offset values in the next pickup operation at the component feeding unit 18.

In detail, the CPU 40 performs correction of the component pickup position by moving the feeding stage 17 by driving the feeding stage drive motor 19 in the X direction and by moving the rotary table 23 by driving the index system in the Y direction, by controlling the feeding stage drive motor 19 and the index system according to these added values (modified offset values). Then, the suction nozzle 24 descends and picks up the electronic component 8. This pickup operation according to the added value is performed until the count number reaches the predetermined pickup number C.

Then, when the CPU 40 determines that the count number of the first counter reaches the predetermined pickup number C and the pickup operation becomes stable, the CPU 40 makes control to reduce a feedback rate. In detail, the CPU 40 adds the initial value A to a value obtained by multiplying a negative coefficient a by the pickup count number c to obtain the temporary coefficient At. Then, the CPU 40 calculates the feedback value R by multiplying this temporary coefficient At by the average r, and stores the feedback value R in the RAM 41. Furthermore, the CPU 40 adds the calculated feedback value R to the offset values of the component pickup position for the X and Y directions to modify the offset values, and uses the modified offset values in the next pickup operation at the component feeding unit 18, as described above.

Figure 4:
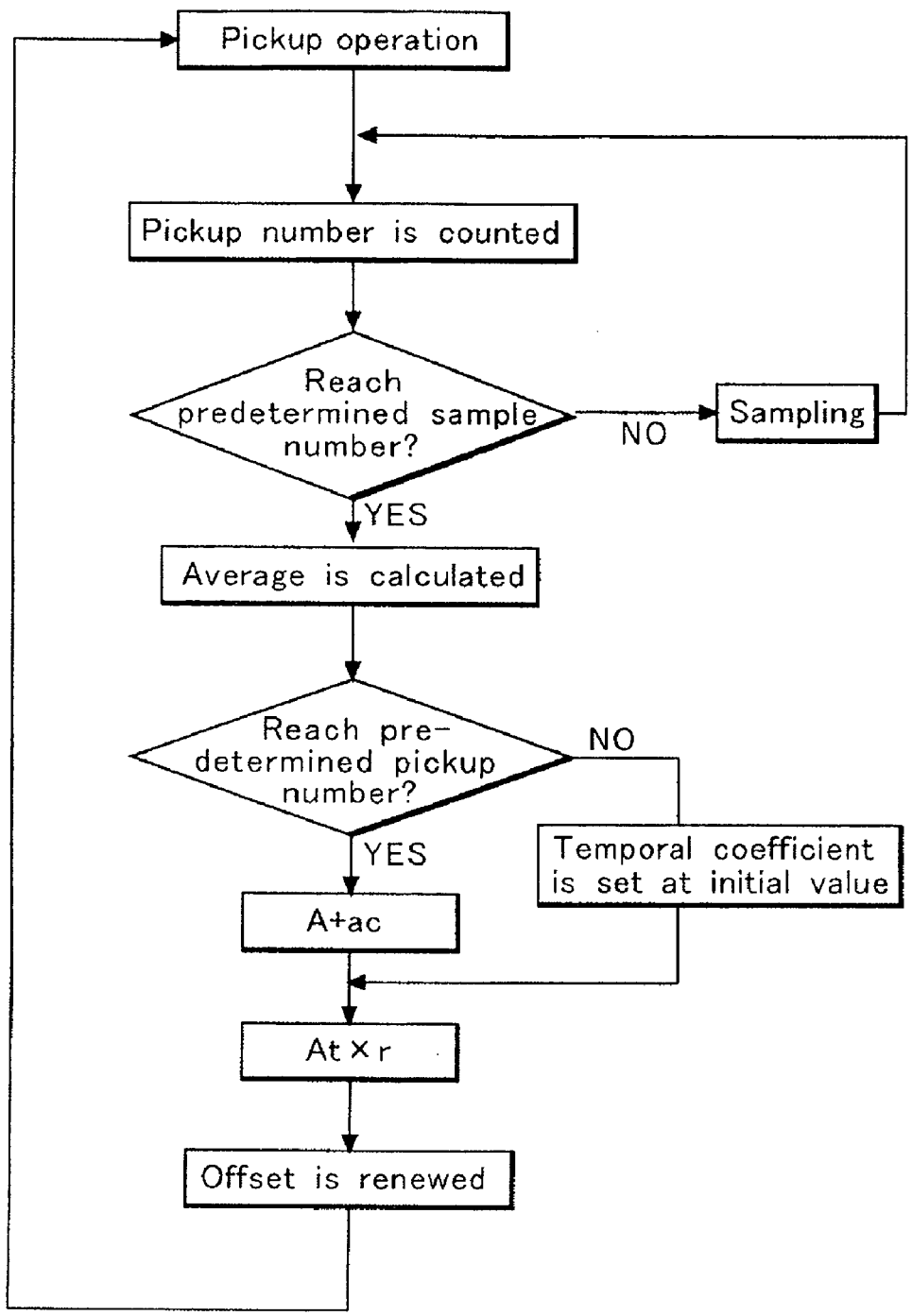
FIG. 4 is a flowchart of a first embodiment of the invention.

In the flow chart shown in FIG. 4, suppose that the sample number Sm is 10 and the pickup number C is 100. When the pickup count number c is between 10 and 100, the CPU 40 calculates the average of the positional shifting amounts r from the data stored in the RAM 41. The CPU 40 sets the coefficient At to an initial value, i.e., the initial value A. In this embodiment, the initial value A is 0.5, i.e., A=0.5. Then, the CPU 40 calculates the feedback value R, i.e., R=At×r. This value R is added to the offset value of the component pickup position. When the pickup count number c is equal to 100 or larger, the coefficient At is calculated based on the following relationship:

$$At \text{ (temporary coefficient)} = A\text{(initial value)} + a\text{(negative coefficient)} \times c\text{(pickup count number)}$$

The coefficient a is a negative number and determined so that the calculated At falls between 0 and 1. For example, since A=0.5 in this embodiment, the value of the negative coefficient a may be −0.001. Accordingly, when c=200, At =0.5− 0.2=0.3. As a result, when the pickup count number c is equal to 100 or larger, the feedback value R, i.e., At×r, reduces because the coefficient A reduces.

Instead of obtaining the temporary coefficient At by adding the initial value A to the value obtained by multiplying the negative coefficient a by the pickup number c, the feedback rate can be reduced by resetting the pickup count number once and reducing the coefficient At as the pickup number c increases after the resetting. Alternatively, for obtaining the temporary coefficient At, a relational expression which reduces the coefficient At as the pickup count number increases after the counter number of the first counter reaches the predetermined pickup number C can be used, besides the above methods.

By performing the pickup operation of the electronic component as described above, a reaction against disturbance reduces and the pickup operation can be more stabilized.

Figure 5:
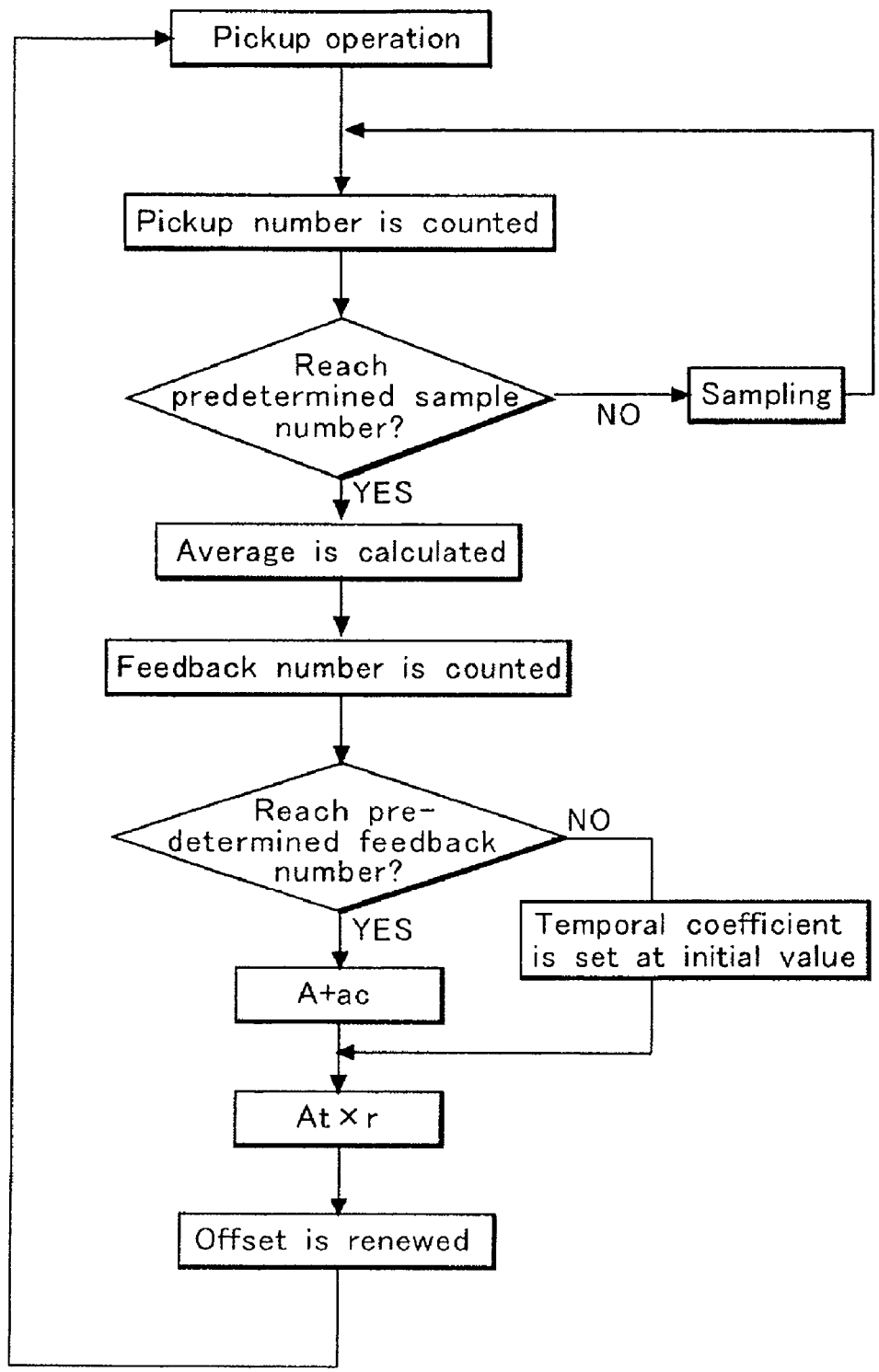
FIG. 5 is a flowchart of a second embodiment of the invention.

Next, a control for stabilizing the pickup operation of a second embodiment will be described based on a flowchart of FIG. 5. First, when the pickup operation in which the suction nozzle 24 picks up the electronic component 8 from the component feeding unit 18 is performed, a second counter (not shown) for counting a pickup number is incremented by 1. Then, the CPU 40 determines whether or not the count number reaches a predetermined sample number Sm. When the CPU 40 determines that the count number does not reach the predetermined sample number Sm, a sampling operation is performed. The image of the electronic component 8 taken by the component recognition camera 15 as described above is recognized by the recognition processing device 43, and when the positional shift of the electronic component 8 on the suction nozzle 24 is recognized, the positional shifting amount is stored in the RAM 41.

Then, the electronic component 8 is sequentially picked up from the component feeding unit 18. When the CPU 40 determines that the count number of the second counter (not shown) reaches the predetermined sample number Sm, the CPU 40 calculates an average r of the positional shifting amounts of the electronic components 8 on the suction nozzles 24 stored in the RAM 41 and stores the average r in the RAM 41. Then, a third counter (not shown) adds 1 to a feedback count number f, and the CPU 40 determines whether or not this count number reaches a predetermined feedback number F.

When the CPU 40 determines that the count number does not reach the predetermined feedback number F, the CPU 40 sets a temporary coefficient At at an initial value A which is obtained on trial as an optimum value and stores it in the RAM 41.

Then, the CPU 40 calculates a feedback value R by multiplying the initial value A as the temporary coefficient At by the average r, and stores the feedback value R in the RAM 41. Furthermore, the CPU 40 adds the calculated feedback value R to the offset values of the component pickup position for the X and Y directions to modify the offset values, and uses this modified offset values in the next pickup operation at the component feeding unit 18.

In detail, the CPU 40 performs correction of the component pickup position by moving the feeding stage 17 by driving the feeding stage drive motor 19 in the X direction and by moving the rotary table 23 by driving the index system in the Y direction, by controlling the feeding stage drive motor 19 and the index system based on these added values (modified offset values). Then, the suction nozzle 24 descends and picks up the electronic component 8. This pickup operation based on the added value is performed until the count number reaches the predetermined feedback number F.

Then, when the CPU 40 determines that the count number of the third counter reaches the predetermined feedback number F and the pickup operation becomes stable, the CPU 40 makes control to reduce a feedback value. In detail, the CPU 40 adds the initial value A to a value obtained by multiplying a negative coefficient a by the feedback count number f to obtain the temporary coefficient At. Then, the CPU 40 calculates the feedback value R by multiplying this temporary coefficient At by the average r, and stores the feedback value R in the RAM 41. Furthermore, the CPU 40 adds the calculated feedback value R to the offset values of the component pickup position for the X and Y directions to modify the offset values, and uses the modified offset values in the next pickup operation at the component feeding unit 18, as described above.

By performing the pickup operation of the electronic component as described above, a reaction against disturbance reduces and the pickup operation can be more stabilized.

Figure 6:
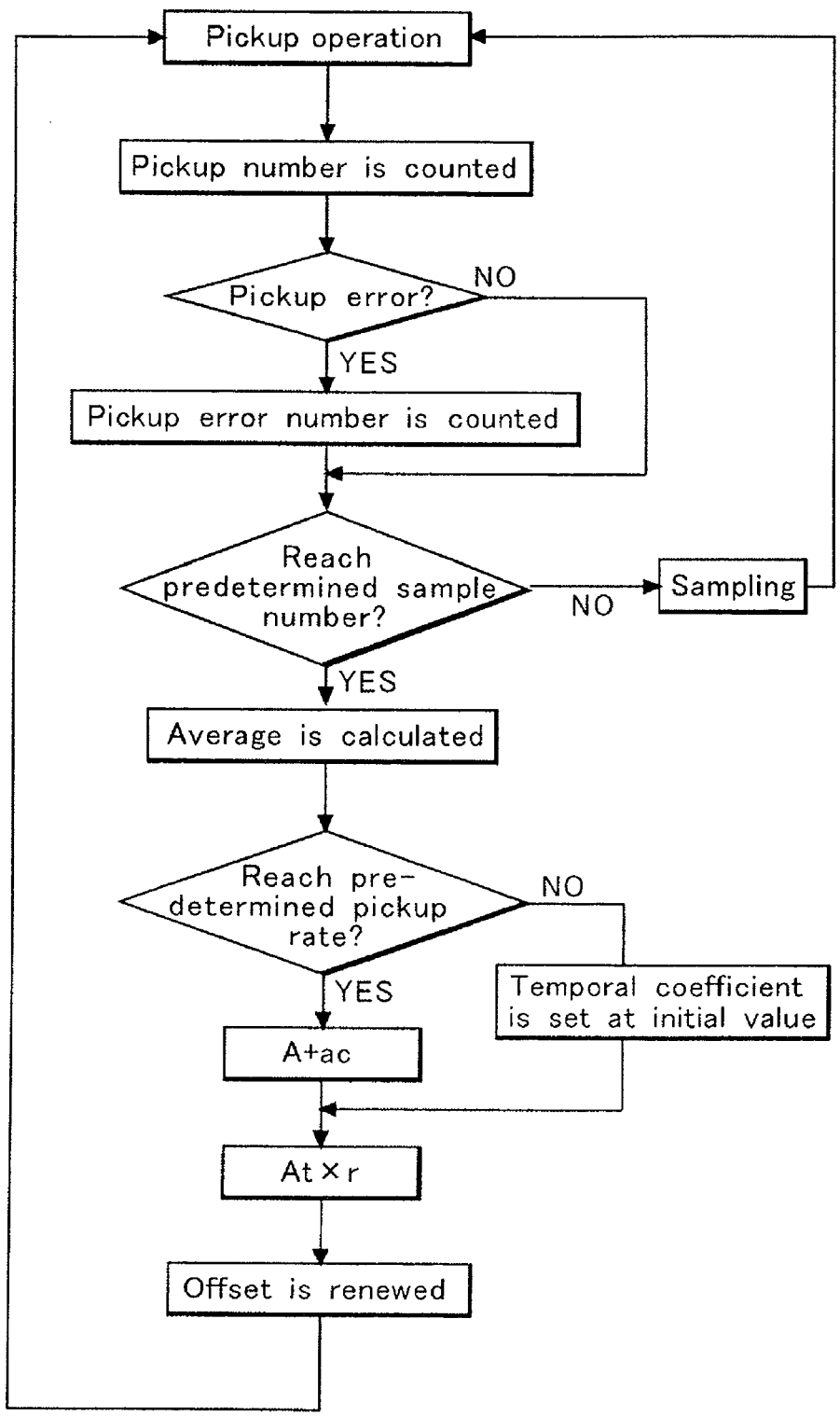
FIG. 6 is a flowchart of a third embodiment of the invention.

Next, a control for stabilizing the pickup operation of a third embodiment will be described based on a flowchart of FIG. 6. First, when the pickup operation in which the suction nozzle 24 picks up the electronic component 8 from the component feeding unit 18 is performed, a fourth counter (not shown) for counting a pickup number is incremented by 1. Then, the CPU 40 determines whether or not a pickup error occurs although the pickup operation is performed.

When the CPU 40 determines that no pickup error occurs, the CPU 40 determines whether or not the pickup count number reaches a predetermined sample number Sm. When the CPU 40 determines that the pickup count number does not reach the sample number Sm, a sampling operation is performed and the next pickup operation is performed. However, when the CPU 40 determines that the pickup error occurs, a fifth counter (not shown) for counting a pickup error number is incremented by 1 and calculates a pickup rate $R=(1-e/c)$ based on the pickup count number c and the pickup error count number e. Then, the CPU 40 determines whether or not the pickup count number reaches the predetermined sample number Sm as above. When the CPU 40 determines that the pickup count number does not reach the sample number Sm, the sampling operation is performed and the next pickup operation is performed.

While the pickup operations are performed in this manner, when the CPU 40 determines that the count number of the fourth counter (not shown) reaches the predetermined sample number Sm, the CPU 40 calculates an average r of the positional shifting amounts of the electronic components 8 on the suction nozzles 24 stored in the RAM 41 and stores the average r in the RAM 41.

Then, the CPU 40 determines whether or not the pickup rate reaches the predetermined pickup rate R. When the CPU 40 determines that the pickup rate does not reach the predetermined pickup rate R, the CPU 40 sets a temporary coefficient At at an initial value A which is obtained on trial as an optimum value and stores it in the RAM 41.

Then, the CPU 40 calculates a feedback value R by multiplying the initial value A as the temporary coefficient At by the average r, and stores the feedback value R in the RAM 41. Furthermore, the CPU 40 adds the calculated feedback value R to the offset values of the component pickup position for the X and Y directions to modify the offset values, and uses these modified offset values in the next pickup operation at the component feeding unit 18.

In detail, the CPU 40 performs correction of the component pickup position by moving the feeding stage 17 by driving the feeding stage drive motor 19 in the X direction and by moving the rotary table 23 by driving the index system in the Y direction, by controlling the feeding stage drive motor 19 and the index system based on this added values (modified offset values). Then, the suction nozzle 24 descends and picks up the electronic component 8. This pickup operation based on the added values is performed until the pickup rate reaches the predetermined pickup rate R.

The pickup rate based on the count numbers of the fourth and fifth counters increases as the pickup operation becomes stabilized after the operation starts. When the CPU 40 determines that the pickup rate reaches the predetermined pickup rate R, the CPU 40 makes control to reduce a feedback value. In detail, the CPU 40 adds the initial value A to a value obtained by multiplying a negative coefficient a by the pickup count number c to obtain a temporary coefficient At. Then, the CPU 40 calculates the feedback value R by multiplying this temporary coefficient At by the average r, and stores the feedback value R in the RAM 41. Furthermore, the CPU 40 adds the calculated feedback value R to the offset values of the component pickup position for the X and Y directions to modify the offset values, and uses the modified offset values in the next pickup operation at the component feeding unit 18, as described above.

By performing the pickup operation of the electronic component as described above, a reaction against disturbance reduces and the pickup operation can be more stabilized.

While the negative coefficient a is stored in the RAM 41 in advance in the embodiments, a plurality of negative coefficients can be stored in the RAM 41 in advance so that selection can be made therefrom.

Although a rotary table type high-speed chip mounter is used as an electronic component mounting apparatus of the embodiments, the invention is not limited to this and a multifunctional chip mounter can be used instead.

Although the embodiments of the invention have been disclosed in detail, it will be recognized that variations or modifications of the disclosed method and apparatus are possible based on the disclosure for those skilled in the art and lie within the scope of the present invention.

What is claimed is:

1. A method of mounting an electronic component, comprising:
repeating a mounting operation comprising performing a pickup operation of picking up an electronic component using a suction nozzle from a component feeding unit based on an offset value from a proper pickup position, calculating a positional shift of the picked up electronic component with respect to the suction nozzle, storing the calculated positional shift in a memory, counting the number of the pickup operations, and mounting the picked up electronic component on a printed board;
calculating a first feed back value by multiplying an average of the stored positional shifts by an initial value, when the number of the pickup operations is smaller than a predetermined number, and calculating a second feed back value by multiplying the average of the stored positional shifts by a temporary value, when the number of the pickup operations is larger than or equal to the predetermined number, the temporary value being calculated by adding to the initial value the number of the pickup operations multiplied by a negative number; and
adding the first feed back value to the offset value, when the number of the pickup operations is smaller than the predetermined number, and adding the second feed back value to the offset value, when the number of the pickup operations is larger than or equal to the predetermined number,
wherein the initial value is larger than 0 and less than or equal to 1.

* * * * *